(12) United States Patent
Morisawa et al.

(10) Patent No.: US 7,692,678 B2
(45) Date of Patent: Apr. 6, 2010

(54) LASER LIGHT CONTROL DEVICE FOR IMAGE FORMING APPARATUS, AND IMAGE FORMING APPARATUS

(75) Inventors: Akira Morisawa, Kashiwa (JP); Yoshihiro Ishibe, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 245 days.

(21) Appl. No.: 11/844,310

(22) Filed: Aug. 23, 2007

(65) Prior Publication Data

US 2008/0049797 A1 Feb. 28, 2008

(30) Foreign Application Priority Data

Aug. 23, 2006 (JP) ............................. 2006-226726
Aug. 21, 2007 (JP) ............................. 2007-214744

(51) Int. Cl.
*B41J 2/435* (2006.01)
*B41J 2/47* (2006.01)

(52) U.S. Cl. ...................... 347/235; 347/250
(58) Field of Classification Search ................ 347/229, 347/234–237, 246–250; 359/204.1
See application file for complete search history.

(56) References Cited

U.S. PATENT DOCUMENTS

| 5,210,634 | A | 5/1993 | Iwama |
| 5,309,270 | A | 5/1994 | Yamakawa |
| 6,144,680 | A | 11/2000 | Kaji et al. |
| 6,243,126 | B1 | 6/2001 | Ueno |
| 6,919,978 | B2 * | 7/2005 | Kudo ................ 359/204.1 |

FOREIGN PATENT DOCUMENTS

| EP | 1111903 A1 | 6/2001 |
| EP | 1775622 A1 | 4/2007 |
| JP | 9-321377 A | 12/1997 |
| JP | 2003191520 A * | 7/2003 |

OTHER PUBLICATIONS

European Search Report issued in corresponding EP application No. 05517899EP01, dated Nov. 19, 2007.

* cited by examiner

*Primary Examiner*—Hai C Pham
(74) *Attorney, Agent, or Firm*—Rossi, Kimms & McDowell LLP

(57) ABSTRACT

A laser light control device for an image forming apparatus designed to improve the auto power control (APC) accuracy and to reduce the control time. A multifunctional optical element has a plurality of different optical characteristics. A detecting unit is adapted to detect laser light from the semiconductor laser. A control unit is adapted to perform control of the write start position of the laser light in the main scanning direction and control of the quantity of the laser light by detecting the laser light by means of the detecting unit after passage of the laser light through the multifunctional optical element.

4 Claims, 5 Drawing Sheets

LASER LIGHT CONTROL DEVICE FOR IMAGE FORMING APPARATUS, AND IMAGE FORMING APPARATUS

BACKGROUND OF THE INVENTION

1. Field of the Invention

The present invention relates to a laser light control device for an image forming apparatus, and an image forming apparatus.

2. Description of the Related Art

The optical power characteristics of a semiconductor laser are sensitive to changes in ambient temperature. Therefore, the optical power of the semiconductor laser varies largely due to changes in ambient temperature or self-heat generation for example, even during constant-current drive. To cope with this temperature dependence of the optical power, a photodiode (PD) called a monitor diode is ordinarily incorporated in a package for a semiconductor laser. This causes the optical power from back light from the semiconductor laser to be monitored, thereby providing a control of the drive current to constantly maintain the optical power. A drive circuit having such a feedback mechanism to control the light quantity of a semiconductor laser is referred to as an auto power control (APC) circuit (automatic optical power control circuit).

In a drive circuit which turns on/off a semiconductor laser according to image data in a printer with a laser light control device, or the like, the auto power control (APC) is ordinarily performed by lighting a laser for a certain time period outside an image area, because the laser lighting time is irregular.

An arrangement using in an APC circuit for laser scanning device a photodiode-integrated-type laser diode having a photodiode integrally incorporated in a package has advantages mentioned below. That is, it is capable of reducing the disposition space, eliminates the need for independent wiring and is advantageous in simplifying the construction of the laser scanning device and reducing the cost in comparison with an arrangement in which the emission output from a semiconductor laser is monitored with a discrete photodiode arranged separately from the laser diode.

With the above-described arrangement, however, laser light quantity control of high accuracy has not been realized even by performing APC, because the quantity of back light from the semiconductor laser received by the photodiode in the package also varies slightly with changes in the temperature of the semiconductor laser.

A system is known in which forward light emitted from a package of a semiconductor laser is used for APC (see, for example, Japanese Laid-Open Patent Publication (Kokai) No. H09-321377).

In the above-described arrangement, however, there is a need to respectively provide a photodiode for detecting the main scanning position of laser light (image writing start reference signal: BD signal) and a photodiode for detecting the quantity of light.

It is preferable to use one photodiode as a photodiode for detecting the main scanning position of laser light (image writing start reference signal: BD signal) and as a photodiode for detecting the quantity of light. However, the region in which the position of the photodiode in the laser light main scanning direction can be set is so restricted that the area occupied by the light receiving surface of the disposed photodiode is small, and the time at which the quantity of laser light is detected is the time at which laser light passes the photodiode during scanning along one line. Therefore, the time period during which the quantity of laser light is detected with the photodiode is extremely short. With such an arrangement, the quantity of laser light cannot be accurately detected if the response of the photodiode is low or the time period required for convergence of APC control is long. In such a case, it is difficult to perform feedback control with stability.

SUMMARY OF THE INVENTION

The present invention provides a laser light control device for an image forming apparatus, and the image forming apparatus designed to improve the APC accuracy and to reduce the control time.

In a first aspect of the present invention, there is provided a laser light control device for an image forming apparatus, having a semiconductor laser, comprising: a multifunctional optical element having a plurality of different optical characteristics; a detecting unit adapted to detect laser light from the semiconductor laser; and a control unit adapted to perform control of the write start position of the laser light in the main scanning direction and control of the quantity of the laser light by detecting the laser light by means of the detecting unit after passage of the laser light through the multifunctional optical element.

The multifunctional optical element can have a first optical characteristic as a function to collect the laser light on the detecting unit for the purpose of performing control of the write position control in the main scanning direction, and has a second optical characteristic as a function to make the laser light substantially stationary on the detecting unit for the purpose of performing control of the quantity of the laser light.

The control unit can use a signal start portion of the detecting unit during control of the write start position in the main scanning direction, and use a signal-stabilized portion of the detecting unit during control of the quantity of the laser light.

The control unit can have a feedback control for controlling a drive current of the semiconductor laser by a signal output from the detecting unit during control of the quantity of the laser light.

The control unit can control the semiconductor laser at a first emission light quantity while stopping the function of the feedback control at a start of laser lighting of the semiconductor laser and controls the semiconductor laser at a second emission light quantity by starting the function of the feedback control when the output from the detecting unit is within a specified value.

In a second aspect of the present invention, there is provided an image forming apparatus having the laser light control device.

According to the present invention, it is possible to avoid lowness of the response of a photodiode for receiving the quantity of laser light and a reduction in accuracy of laser light quantity control due to a deficiency of convergence time in the auto power control (APC), and to prevent excessive emission of laser light.

Further features of the invention will become more apparent from the following detailed description taken in conjunction with the accompanying drawings.

DETAILED DESCRIPTION OF THE PREFERRED EMBODIMENTS

The present invention will now be described in detail below with reference to the accompanying drawings showing preferred embodiment thereof.

Figure 1:
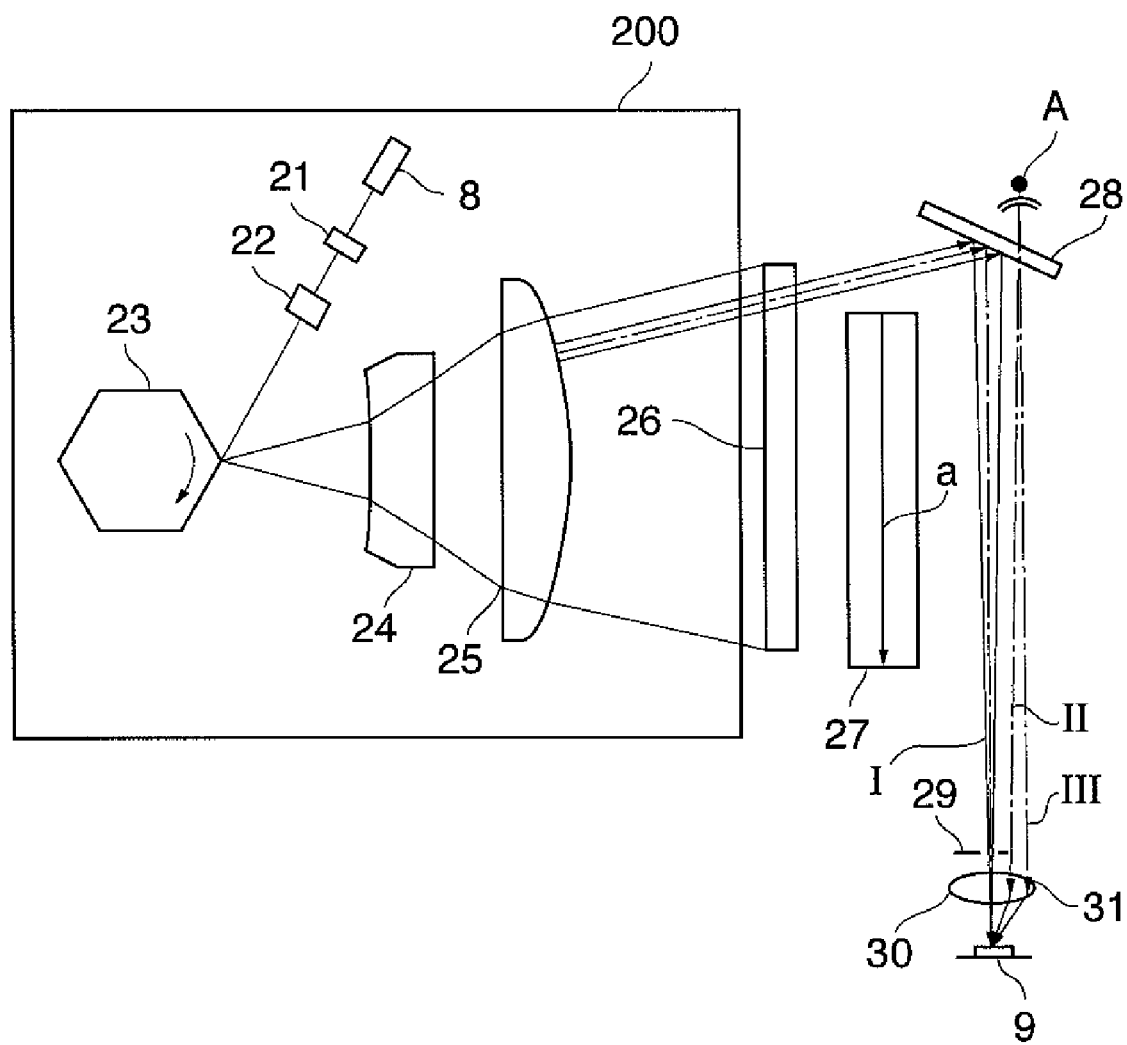
FIG. 1 is a diagram schematically showing the construction of an image forming apparatus having a laser control device according to an embodiment of the present invention.

FIG. 1 is a diagram schematically showing the construction of an image forming apparatus having a laser controller according to an embodiment of the present invention.

Referring to FIG. 1, a laser output unit 200 is constituted by a laser diode 8 as a semiconductor laser, a collimator lens 21, a slit 22, a rotating polygonal mirror 23, and scanning lenses 24 and 25.

The laser diode 8 is driven in emitting light by a laser drive circuit 300 (laser light control device) described below with reference to FIG. 2 to emit a predetermined quantity of light. Laser light emitted from the laser diode 8 passes through the collimator lens 21 and the slit 22 and reaches the rotating polygonal mirror 23. The rotating polygonal mirror 23 is rotated at a constant angular velocity by a rotating polygonal mirror drive circuit (not shown) including a scanner motor. The laser light that has reached the rotating polygonal mirror 23 is deflected and scanned by the rotating polygonal mirror 23 and is changed by the scanning lenses 24 and 25 so that the linear velocity of beam scanning on a photosensitive drum (image bearing member) 27 is constant. A plane in which the laser light is deflected and scanned by the rotating polygonal mirror 23 is referred to as "the main scanning plane", and a direction which is perpendicular to an optical axis of the scanning lens 24, 25 and parallel with the main scanning plane. Moreover, a direction which is substantially perpendicular to the main scanning direction is referred to as "the sub scanning direction". The photosensitive drum 27 has a main scanning direction a.

A detection sensor 9 (detecting unit) which can receive laser light passing through the scanning lenses 24 and 25, and which is featured by the present invention, is disposed at a position corresponding to a non-image formation region on the photosensitive drum 27. The detection sensor 9 is constituted by a photodiode. Laser light is led to the detection sensor 9 via a BD slit 29, as well as a BD lens 30 and an APC lens 31 which constitute a multifunctional optical element having a plurality of different optical characteristics. The BD slit 29 is arranged at a location equivalent to that of the photosensitive drum 27. The laser light having passed through the scanning lenses 24, 25 is focused in a spot manner on the BD slit 29, and then led to the detection sensor 9 through the BD lens 30 disposed behind the BD slit 29. In an image region, the laser light travels via a reflecting mirror 26 after passing through the scanning lenses 24 and 25, and scans the photosensitive drum 27 to form a latent image. The latent image formed on the photosensitive drum 27 is developed with toner, followed by transfer and fixation for image formation.

The collimator lens 21 makes the laser light parallel light, and the slit 22 restricts the light beam width of the parallel light within a desired range.

(Outline of Operation of Laser Drive Circuit)

Figure 2:
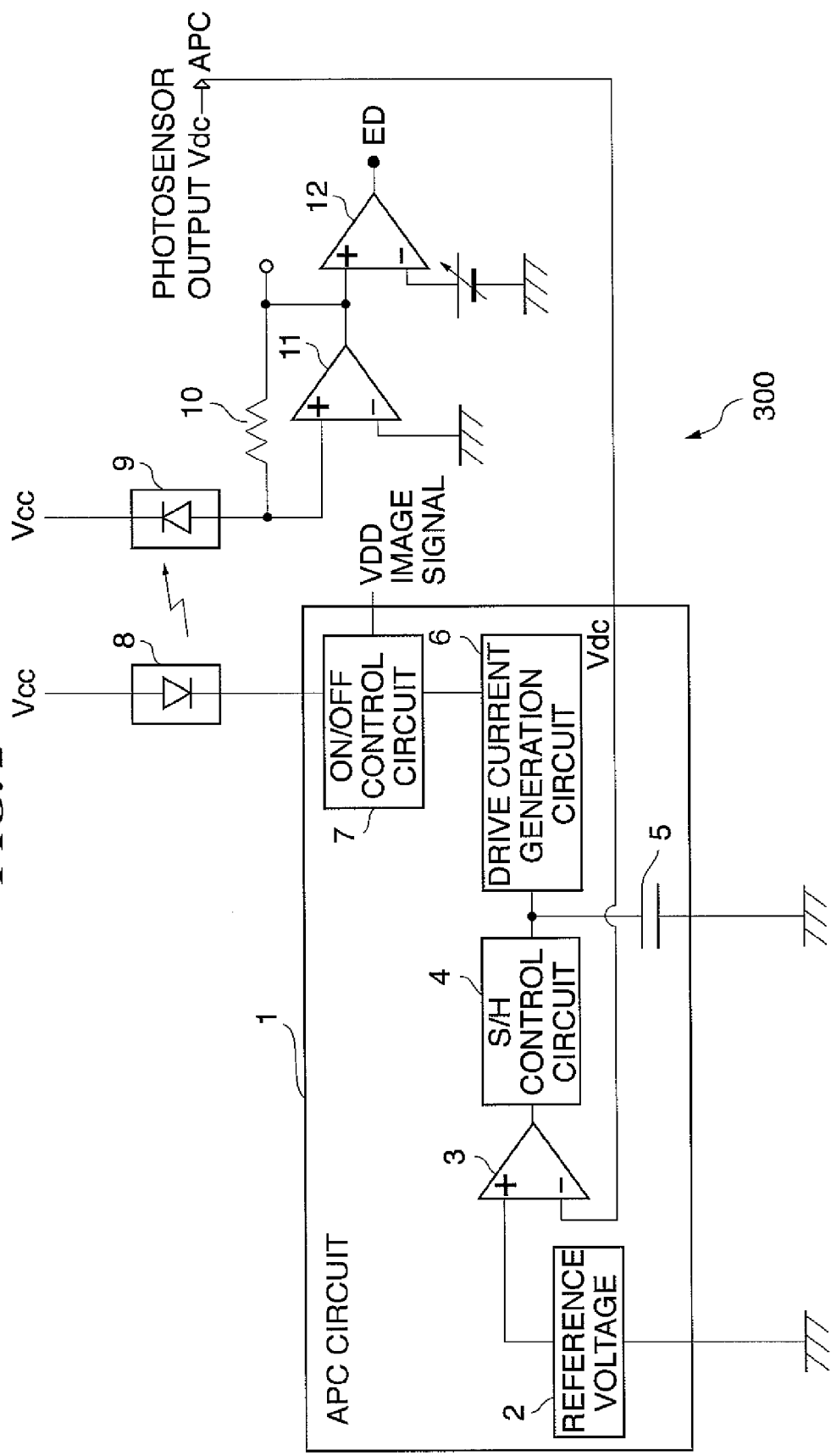
FIG. 2 is a block diagram showing the internal configuration of a laser drive circuit for driving a laser diode 8 in emitting light shown in FIG. 1.

FIG. 2 is a block diagram showing the internal configuration of the laser drive circuit for driving the laser diode 8 in emitting light shown in FIG. 1.

Referring to FIG. 2, the laser drive circuit 300 performs automatic optical power control (APC) controlling the quantity of light from the laser diode, and detects the main scanning position of laser light.

The laser drive circuit 300 is constituted by an APC circuit 1, the laser diode 8, the detection sensor 9, a resistor 10 and differential amplifiers 11 and 12, etc.

The APC circuit 1 is constituted, as a feedback control unit, by a reference voltage generation circuit 2, a sample/hold (abbreviated as S/H hereinafter) control circuit 4, a S/H capacitor 5, a drive current generation circuit 6, and an ON/OFF control circuit 7.

The detection sensor 9 detects (monitors) output from the laser diode 8 and outputs a current (signal) according to the intensity (quantity) of laser light.

The current output from the detection sensor 9 is compared with a reference voltage Vref-1 in the differential amplifier 12. If the reference voltage Vref-1 is exceeded, a BD signal used as an image writing start reference signal is generated.

From the current output from the detection sensor 9, a detected voltage Vdtc for APC is output through the resistor 10. The output Vdtc is input to a differential amplifier 3 together with a reference voltage generated in the reference voltage generation circuit 2. The difference between these voltages including the polarity is amplified.

The S/H control circuit 4 performs control by inputting/outputting a charge/discharge current to the S/H capacitor 5 according to the output signal from the differential amplifier 3 when a S/H control signal supplied from an engine control circuit (not shown) requests sampling, and by opening the circuit between the S/H control circuit 4 and the S/H capacitor 5 when the engine control circuit requests holding.

When sampling is requested by the S/H control signal, the signal according to the difference between the PD voltage signal (detected voltage Vdtc for APC) input to the differential amplifier 3 and the reference voltage is amplified and input to the S/H control circuit 4.

When Vdtc is higher than the reference voltage, the differential amplifier output draws in a discharge current from the S/H capacitor 5 through the S/H control circuit 4. When Vdtc is lower than the reference voltage, a charge current is output from the difference amplifier output to the S/H capacitor 5 through the S/H control circuit 4. When Vdtc is equal to the reference voltage, charging/discharging is not performed.

The voltage across the S/H capacitor 5 is input to the laser diode drive current generation circuit 6 to determine a current value for driving the laser diode 8 according to the voltage across the S/H capacitor 5. An image signal (video signal, abbreviated as "VDO" hereinafter) input from an image control circuit (not shown) is received. The light emitting operation of the laser diode 8 driven in a turning on/off manner by the VDO signal is performed on the basis of the drive current value determined by the drive current generation circuit 6.

(Explanation of Detection Sensor 9)

Figure 5:
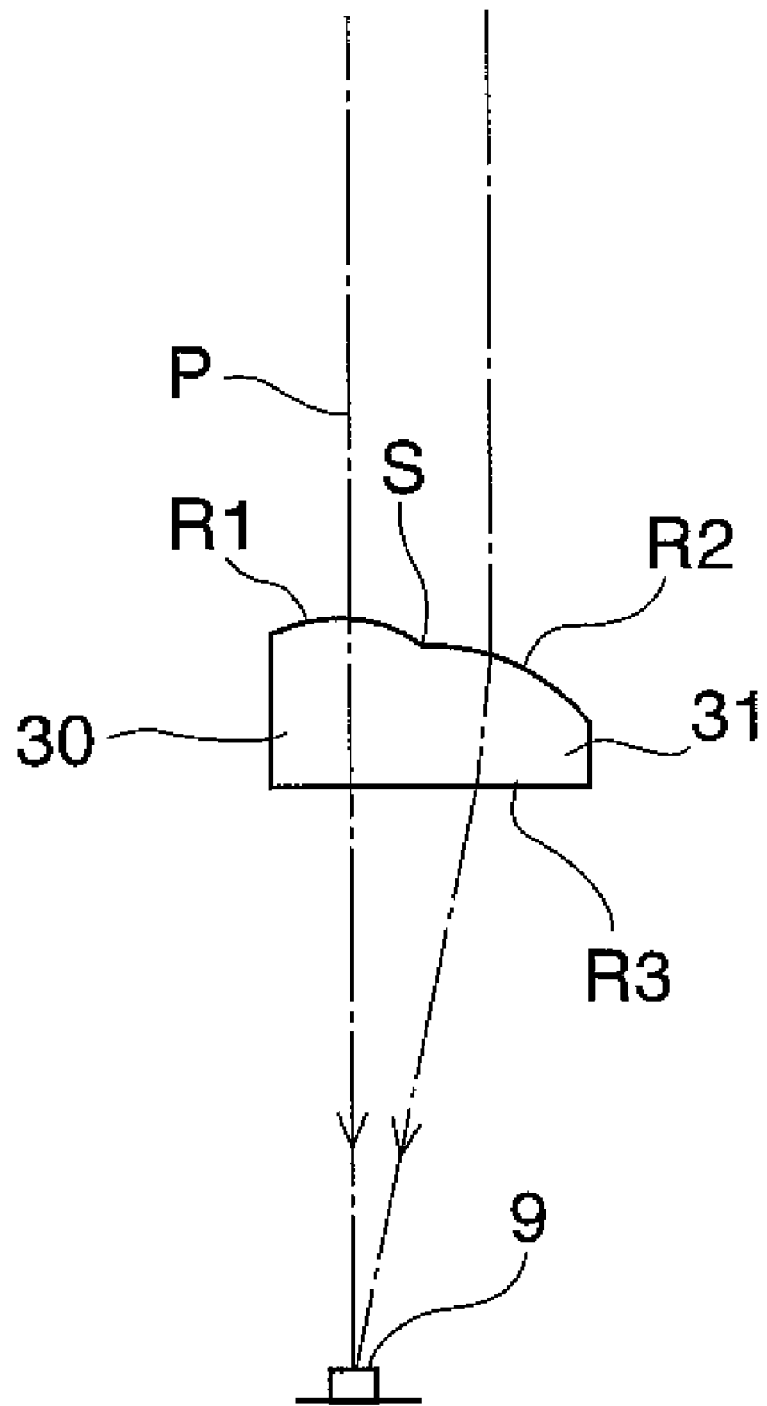
FIG. 5 is a diagram for explaining the construction of a BD lens 30 and an APC lens 31 formed as an integral type.

The construction of the detection sensor 9 will be described with reference to FIG. 1. In the present embodiment, the BD lens 30 used to produce an image writing start reference signal (BD signal) for performing image writing start position control in the main scanning direction and the APC lens 31 used to control the light quantity are formed as an integral type multifunctional optical element such as shown in FIG. 5. Any multifunctional optical element other than the integral type may alternatively be used insofar as it enables laser light to be incident on the detection sensor 9.

The BD lens 30 has a first optical characteristic, and is contoured with respect to at least the sub scanning direction so as to have such a refractive power as that a reflection surface of the BD mirror and the detection sensor 9 have an optical conjugate relation with each other. This enables the laser light to be led to the detection sensor 9 even if, for example, the BD mirror 28 is attached with angular error with respect to the sub scanning direction.

The APC lens 31 has a second optical characteristic, and is contoured with respect to at least the main scanning direction so as to have such a refractive power as that a position on the detection sensor 9, to which the laser light deflected and scanned by the rotating polygonal mirror 23 reaching through the lens APC 31, is made substantially statinary during scanning. That is, the first optical characteristic and the second optical characteristic are different from each other.

In FIG. 1, I designates a laser light exhibited at the time of BD detection, II designates a main light beam of the laser light entering the APC lens 31 after a lapse of a predetermined time period from the BD detection, and III designates a main light beam of the laser light after a lapse of further predetermined time period.

The APC lens 31 is contoured with respect to at least the main scanning direction so as to have such a refractive power as that a point A, at which an extended line of the main light beam II and an extended line of the main light beam III intersect with each other, and the detection sensor 9 have an optical conjugate relation with each other. This enables a position on the detection sensor 9, to which the laser light deflected and scanned by the rotating polygonal mirror 23 reaching through the lens APC 31, to be made substantially stationary during scanning.

The BD mirror surface 28 reflects laser light which has been deflected by the rotating polygonal mirror 23 and has passed through the scanning lenses 24 and 25, thereby enabling the detection sensor 9 to sense the reflected light.

According to the above-described arrangement, laser light which has been reflected by the rotating polygonal mirror 23 and has passed through the scanning lenses 24 and 25 is collected by the BD lens 30 to be sensed with the detection sensor 9, and the image writing start reference signal (BD signal) for timing of image write starting is generated on the basis of the sensed light.

The laser light incident on the detection sensor 9 through the APC lens 31 is made substantially still on the detection sensor 9. Laser light control is performed by the above-described APC circuit 1 on the basis of the substantially still laser. The BD lens 30 and the APC lens 31 integrally formed differ in shape from each other and, therefore, the slit 29 existing in the optical path has a role to prevent generation of flare at a junction between the BD lens 30 and the APC lens 31.

Accordingly, the laser drive circuit 300 uses a signal start portion of the detection sensor 9 when first performing image write start reference signal control, and uses a signal-stabilized portion (after the signal start portion) of the detection sensor 9 for the auto optical power control (APC).

FIG. 5 shows the construction of the BD lens 30 and the APC lens 31 formed as an integral type.

An incidence face R1 of the BD lens 30 and an incidence face R2 of the APC lens 31 are different in curvature radius from each other with respect to the junction S. An exit face of the BD lens 30 and an exit face of the APC lens 31 have the same shape R3. In the present embodiment, the shape R3 is flat. An optical axis of the BD lens 30 and an optical axis of the APC lens 31 are coaxial with each other, which axis is designated by P in FIG. 5.

A sub scanning direction-wise focal distance Fbds of the BD lens 30 is desired to satisfy the following relationship:

$$0.7\left(\frac{L1 \times L2}{L1 + L2}\right) \le Fbds \le 1.3\left(\frac{L1 \times L2}{L1 + L2}\right),$$

where L1 designates a distance between a reflection face of the BD mirror and the incidence R1 of the BD lens 30, and L2 designates a distance between the exit face R3 of the BD lens and the detection sensor 9.

If the sub scanning direction-wise focal distance Fbds of the BD lens 30 is undesirably set to be beyond the upper limit and the lower limit of the above conditional equation, the laser light cannot be led to the detection sensor 9 in a case where the BD mirror 28 is attached with angular error with respect to the sub scanning direction. This causes the laser light to be led apart from the detection sensor 9 in the sub scanning direction, which makes it not perform the BD detection. In the present embodiment, L1=80 mm and L2=10 mm hold, and hence Fbds=10.76 mm is obtained.

Since $$\frac{L1 \times L2}{L1 + L2} = \frac{80 \times 10}{80 + 10} = 8.88888$$

holds, $$Fbds = 1.21\left(\frac{L1 \times L2}{L1 + L2}\right)$$

is satisfied, thereby resulting in satisfaction of the above-mentioned conditional equation.

A main scanning direction-wise focal distance Fapcm of the APC lens 31 is desired to satisfy the following relationship:

$$0.5\left(\frac{Ff\theta \times L2}{Ff\theta + L2}\right) \le Fapcm \le 1.7\left(\frac{Ff\theta \times L2}{Ff\theta + L2}\right),$$

where Ffθ designates a main scanning direction-wise focal distance of the scanning lens 24, 25, and L4 designates a distance between the exit face R3 of the APC lens 31 and the detection sensor 9 (L2 is identical with L4 in the present invention).

If the main scanning direction-wise focal distance Ffθ of the APC lens 31 is undesirably set to be beyond the upper limit and the lower limit of the above conditional equation, a position on the detection sensor 9, to which the laser light deflected and scanned by the rotating polygonal mirror 23 reaching through the lens APC 31, cannot be made substantially stationary during scanning. This causes the laser light to be led apart from the detection sensor 9, which makes it not stably perform the APC control. In the present embodiment, Ffθ=212.71 mm and L4=10 mm hold, and hence Fapcm=9.6 mm is obtained.

Since $$\frac{Ff\theta \times L2}{Ff\theta + L2} = \frac{212.71 \times 10}{212.71 + 10} = 9.55099$$

holds, $$Fapcm = 1.005\left(\frac{Ff\theta \times L2}{Ff\theta + L2}\right)$$

is satisfied, thereby resulting in satisfaction of the above mentioned conditional equation.

In the present invention, the exit face of the BD lens 30 and the exit face of the APC lens 31 have the same shape R3; however, the both may be different in shape from each other.

In a second embodiment of the present invention, detection of abnormalities (error) in the laser diode 8 and the detection sensor 9 is performed immediately after powering on the laser scanning device and before starting APC.

Figure 3:
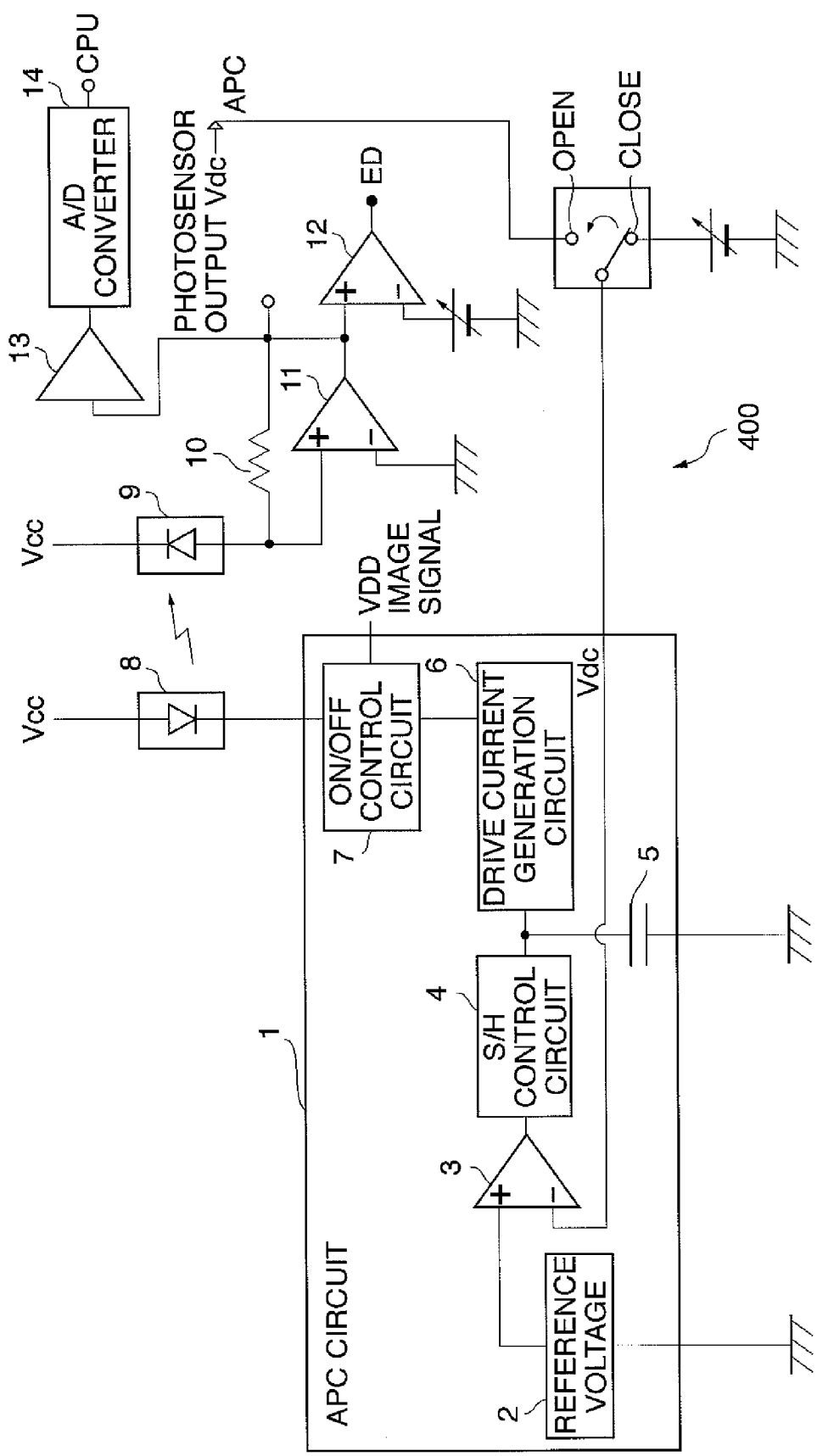
FIG. 3 is a block diagram showing the internal configuration of a laser light controller according to a second embodiment of the present invention.

FIG. 3 is a block diagram showing the internal configuration of a laser light controller according to the second embodiment of the present invention.

A laser drive circuit 400 according to the second embodiment is similar to the laser drive circuit 300 shown in FIG. 2. Therefore the description of the laser drive circuit 400 shown in FIG. 3 will be made only of portions different from the laser drive circuit 300 shown in FIG. 2, and the redundant description on the common portions will not be repeated.

Referring to FIG. 3, a follower 13, an A/D converter 14, and a switch 15 for selection between the feedback loop used by the APC circuit for laser light control and an open loop selected when APC control is not performed are added.

Figure 4:
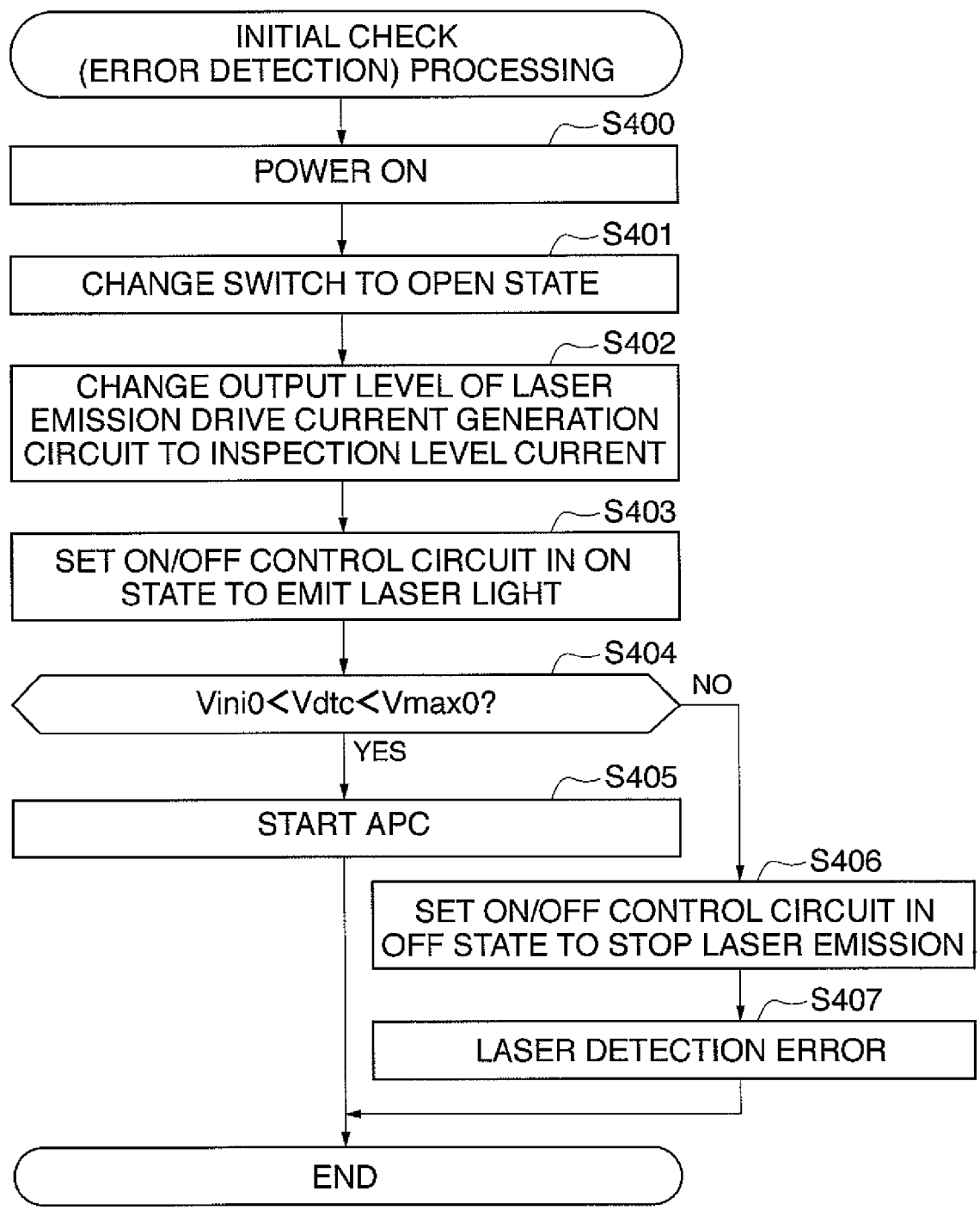
FIG. 4 is a flowchart showing the procedure of initial check (error detection) processing executed by a laser drive circuit 400 shown in FIG. 3.

FIG. 4 is a flowchart showing the procedure of initial check (error detection) processing executed by the laser drive circuit 400 shown in FIG. 3.

This processing is performed by a CPU (not shown) for control of the laser drive circuit 400 controlling each section while using a RAM as a work area on the basis of a control program stored in a ROM.

Referring to FIG. 4, when the power supply for the laser scanning device is turned on in step S400 (when lighting starts), the process proceeds to step S401. In step S401, the switch 15 is first changed into the open state to form the open loop for the operation without the auto power control (APC), which causes the feedback control unit to stop functioning. When the switch 15 is in the closed state, the feedback loop used by the APC circuit for performing laser light control as described in the description of the first embodiment is formed, which causes the feedback control unit to start functioning.

With the change of the switch 15 in step S401, the set value in the laser drive current generation circuit 6 is set to a level I0 such that breakdown of the detection sensor 9 does not occur, in step S402. It is desirable that the I0 be the minimum level as a first emission light quantity in the range in which the output from the detection sensor 9 can be sensed.

The process then proceeds to step S403 and the ON/OFF control circuit 7 is set to the ON state to light the laser diode 8. The laser diode 8 outputs laser light to cause an output current through the detection sensor 9 according to the emission light quantity. Detected voltage Vdtc 0 is thereby output by means of the resistor 10. Vdtc 0 is A/D converted into a digital value by the AD converter 14 to be detected by the CPU via the follower 13.

The process then proceeds to step S404 and determination is made as to whether or not Vdtc 0 is between a threshold value Vini 0 and the maximum output voltage Vmax 0 detected with the detection sensor 9, that is, within a specified value, when the laser drive current is driven at I0. If laser light has been detected, it can be determined that the laser diode 8 and the detection sensor 9 are operating normally and that APC can be performed, followed by, in step S405, the auto power control (APC) being started at a second emission light quantiy.

If the value of the output from the detection sensor 9 is as shown by Vini 0>Vdtc 0 or Vdtc 0>Vmax 0, APC cannot be performed, because the laser diode 8 may be malfunctioning, the detection sensor 9 may be malfunctioning, or the laser optical path may be shifted from the slit 22.

The process then proceeds to step S406 and the ON/OFF control circuit 7 is set in the off state to stop emission of light from the laser diode. In step S407, a display such as "laser detection error" is produced to inform the user of the occurrence of the error.

From this sequence, it is determined that the laser writing device is malfunctioning in initial operation, thereby preventing laser power oscillation during APC control and, hence, breakdown of the detection sensor 9.

While the present invention has been described with reference to exemplary embodiments, it is to be understood that the invention is not limited to the disclosed the embodiments. The scope of the following claims is to be accorded the broadest interpretation so as to encompass all such modifications and equivalent structures and functions.

This application claims the benefit of Japanese Patent Application No. 2006-226726, filed Aug. 23, 2006 and Japanese Patent Application No. 2007-214744, filed Aug. 21, 2007 which are hereby incorporated by reference herein in its entirety.

What is claimed is:

1. A laser light control device for an image forming apparatus including a semiconductor laser and a polygon mirror that deflects and scans laser light emitted from the semiconductor laser to form a latent image on a photosensitive drum, the laser light control device controlling an emission light quantity of the semiconductor laser, the laser light control device comprising:

a detecting unit configured to detect the laser light at a non-image formation region on the photosensitive drum and output a signal based on the detection result;

a signal generating unit configured to generate a first signal and a second signal based on the signal output from said detecting unit;

a control unit configured to perform control of a write start position of the laser light in a main scanning direction based on the first signal and control of the emission light quantity of the laser light based on the second signal; and an optical element including a first configuration so as to exert a refractive power of collecting the laser light, deflected and scanned by the polygon mirror, on the detecting unit for the purpose of allowing the signal generating unit to generate the first signal, and including a second configuration so as to make the laser light, deflected and scanned by the polygon mirror, substantially stationery on said detecting unit for the purpose of controlling the emission light quantity of the laser light, a first configuration-part of the optical element being located at a portion upstream of a second configuration-part of the optical element with respect to a direction of the laser light scanning said detecting unit.

2. A laser light control device according to claim 1, wherein said control unit has a feedback control unit that controls a drive current of said semiconductor laser by the second signal output from said detecting unit during control of the emission light quantity of the laser light.

3. A laser light control device according to claim 2, wherein said control unit is configured to control said semiconductor laser at a first emission light quantity while stopping the function of said feedback control unit at a start of laser lighting of said semiconductor laser and to control said semiconductor laser at a second emission light quantity by starting the function of said feedback control unit when the output from said detecting unit is within a specified value.

4. An image forming apparatus comprising:

a semiconductor laser;

a photosensitive drum;

a polygon mirror that deflects and scans laser light emitted from the semiconductor laser to form a latent image on the photosensitive drum; and a laser light control device that controls an emission light quantity of the semiconductor laser;

wherein the laser light control device includes:

a detecting unit configured to detect the laser light at a non-image formation region on the photosensitive drum and output a signal based on the detection result;

a signal generating unit configured to generate a first signal and a second signal based on the signal output from said detecting unit;

a control unit configured to perform control of a write start position of the laser light in a main scanning direction based on the first signal and control of the emission light quantity of the laser light based on the second signal; and an optical element including a first configuration so as to exert a refractive power of collecting the laser light, deflected and scanned by the polygon mirror, on the detecting unit for the purpose of allowing the signal generating unit to generate the first signal, and including a second configuration so as to make the laser light, deflected and scanned by the polygon mirror, substantially stationery on said detecting unit for the purpose of controlling the emission light quantity of the laser light, a first configuration-part of the optical element being located at a portion upstream of a second configuration-part of the optical element with respect to a direction of the laser light scanning said detecting unit.

* * * * *